(12) United States Patent
Lewis

(10) Patent No.: US 12,197,080 B2
(45) Date of Patent: Jan. 14, 2025

(54) VEHICLE QUANTUM DOT DISPLAY SYSTEM AND METHOD

(71) Applicant: HARMAN INTERNATIONAL INDUSTRIES, INCORPORATED, Stamford, CT (US)

(72) Inventor: Benjamin Edward Lewis, Livonia, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 18/013,471

(22) PCT Filed: Jun. 30, 2020

(86) PCT No.: PCT/US2020/040312
§ 371 (c)(1),
(2) Date: Dec. 28, 2022

(87) PCT Pub. No.: WO2022/005458
PCT Pub. Date: Jan. 6, 2022

(65) Prior Publication Data
US 2023/0273481 A1   Aug. 31, 2023

(51) Int. Cl.
*G02F 1/13357* (2006.01)
*F21V 8/00* (2006.01)
*G02F 1/1335* (2006.01)

(52) U.S. Cl.
CPC ..... *G02F 1/133615* (2013.01); *G02B 6/0023* (2013.01); *G02F 1/133614* (2021.01); *G02F 2202/36* (2013.01)

(58) Field of Classification Search
CPC ......... G02F 1/133615; G02F 1/133614; G02F 2202/36; G02B 6/0023
USPC .......................................................... 362/84
See application file for complete search history.

(56) References Cited

U.S. PATENT DOCUMENTS

| | | | |
|---|---|---|---|
| 11,112,653 B2 * | 9/2021 | Rao | G02B 6/005 |
| 2011/0312116 A1 | 12/2011 | Weiss et al. | |
| 2016/0070137 A1 | 3/2016 | You et al. | |
| 2016/0170262 A1 | 6/2016 | Saneto et al. | |
| 2017/0248745 A1 * | 8/2017 | Ninan | F21V 9/08 |
| 2018/0143497 A1 | 5/2018 | Kim et al. | |
| 2019/0285942 A1 | 9/2019 | Liu et al. | |
| 2020/0251675 A1 * | 8/2020 | Zhang | H10K 71/00 |

FOREIGN PATENT DOCUMENTS

| | | |
|---|---|---|
| CN | 107688270 A | 2/2018 |
| EP | 2711768 A1 | 3/2014 |
| TW | 201724489 A | 7/2017 |
| WO | 2014113658 A1 | 7/2014 |

\* cited by examiner

Primary Examiner — Laura K Tso
(74) Attorney, Agent, or Firm — Brooks Kushman, P.C.

(57) ABSTRACT

A vehicle display system may include a light guide, a quantum dot film arranged adjacent with the light guide and configured to receive blue light from the light guide and convert the blue light to red and green light, at least one buffer film, and a blue color filter arranged between the quantum dot film and the at least one buffer film, the blue color filter configured to transmit blue light back to the quantum dot film to further convert the red and green light.

17 Claims, 5 Drawing Sheets

|  |  | Luminance of system of FIG. 2A | Luminance of system of FIG. 2B |
|---|---|---|---|
| Red | x (CIE 1931) | 0.6426 | 0.6426 |
|  | y (CIE 1931) | 0.2922 | 0.2922 |
|  | cd/m$^2$ | 130.5 | 156.6 |
| Green | x (CIE 1931) | 0.2863 | 0.2863 |
|  | y (CIE 1931) | 0.653 | 0.653 |
|  | cd/m$^2$ | 354.4 | 425.28 |
| Blue | x (CIE 1931) | 0.1504 | 0.1504 |
|  | y (CIE 1931) | 0.0487 | 0.0487 |
|  | cd/m$^2$ | 55.78 | 33.45 |
| White | x (CIE 1931) | 0.2922 | 0.3394 |
|  | y (CIE 1931) | 0.2576 | 0.3284 |
|  | cd/m$^2$ | 552.5 | 615.3 |

FIG. 3

VEHICLE QUANTUM DOT DISPLAY SYSTEM AND METHOD

CROSS-REFERENCE TO RELATED APPLICATIONS

This application is the U.S. National Phase of PCT Application No. PCT/US2020/040312 filed on Jun. 30, 2020, the disclosure of which is hereby incorporated in its entirety by reference herein.

BACKGROUND

As vehicles are including more and more autonomous features and functions, including driving, user preferences, etc., in-vehicle displays are becoming more and more sophisticated. More information is being presented via vehicle displays, and user input via the displays are increasing, thus necessitating the desire for larger and more robust displays, having sufficient durability, brightness, and clarity.

SUMMARY

A vehicle display system may include a light guide, a quantum dot film arranged adjacent with the light guide and configured to receive blue light from the light guide and convert the blue light to red and green light, at least one buffer film, and a blue color filter arranged between the quantum dot film and the at least one buffer film, the blue color filter configured to transmit blue light back to the quantum dot film to further convert the red and green light.

A display system may include a light guide, a quantum dot film arranged adjacent with the light guide and configured to receive blue light from the light guide and convert the blue light to red and green light, and a blue color filter configured to transmit blue light back to the quantum dot film to convert the red and green light.

A method for providing vehicle display system may include providing a light guide, positioning a quantum dot film adjacent to a light guide to receive blue light from the light guide, converting the blue light to red and green light with the quantum dot film, positioning a blue color filter arranged between at least one buffer film and the quantum dot film, and transmitting the blue light back to the quantum dot film to convert the red and green light.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

FIG. 3 illustrates an example chart illustrating the luminance of the systems of FIGS. 2A and 2B for each of red, green, blue and white light;

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Disclosed herein is a quantum dot display white point tuning system having a blue color filter arranged in a back lighting. This display includes a blue reflective filter at the backlight assembly to allow for the blue light to be recycled back to the quantum dot film. This allows for more light to be converted from blue to green and red. The filter may be a sheet or a coating on a buffer film and is most beneficial in a quantum dot display.

Current quantum dot displays may suffer from poor white point tuning, poor backlight power efficiency, and poor brightness. Typical approaches for curing some of these deficiencies include tuning quantum dot film, as well as adding other color filters. However, these approaches may decrease system efficiency by allow more energy to be absorbed at the color filter, as well as increase costs of sorting.

By adding the blue color filter, brightness and true white point tuning may be increased. Since the blue color filter is a reflective color filter film added to the optical stack, color is reflected instead of absorbed. The film may also be tuned to provide more or less light conversion through the quantum dot film. Furthermore, due to commonization of the color filters, only one open cell may be required across all customers.

Accordingly, the system disclosed herein allows the display to convert more of the backlight spectrum from blue to green and red using light recycling. The white-point tuning may be achieved without changing the color filter or the quantum dot between various customers. The display also realizes a reduced power consumption of the QLED, while having an increased brightness.

Figure 1:
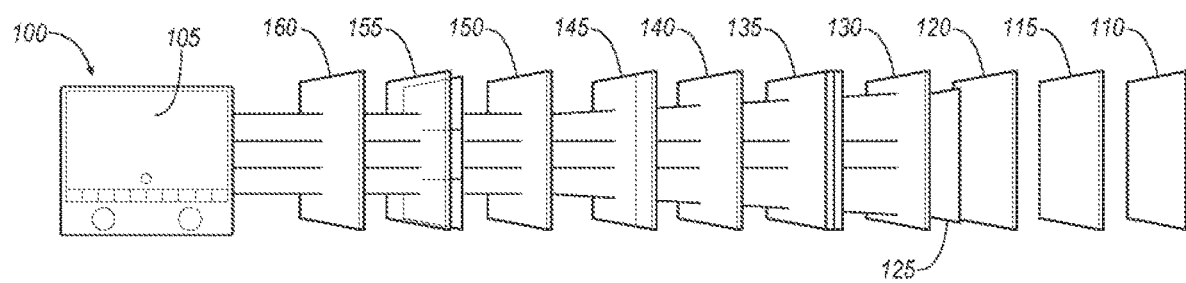
FIG. 1 illustrates an exploded view of a display system in accordance with one embodiment.

FIG. 1 illustrates an exploded view of a display system 100, also referred to as display 100. This display system 100 may be arranged within a vehicle and may be a human-machine-interface configured to provide information to a vehicle occupant, as well as receiving user input by way of a touch screen. In the examples disclosed herein, the display 100 may be a quantum dot display configured to produce monochromatic red, green, and blue light. In these displays, light is produced directly in each pixel by applying electric current to inorganic nan-particles. These displays have the capability to support large, flexible displays that do not degrade as rapidly as other light emitting diode (LED) displays (e.g., OLEDs).

The display 100 may include various 'layers', as described herein. The display 100 may include a back cover 110 configured to protect the layers of the display 100 from the rear side. The back cover 110 may abut and be attached to the vehicle from an area inside a dashboard, center console, or the like. A reflector 115 may be arranged adjacent to the back cover 110 and may be configured to reflect any light that exits the back of the display 100.

The display 100 may include a light guide 120. The light guide 120, also known as a light guide plate (LGP), may allow light from a light source to pass through. A quantum dot (QD) film 125 may be a film adhered to or coated onto the light guide 120. The QD film 125 may be DBEF or BEF containing red- and green-emitting quantum dots that are tuned to each display system 100 and is illuminated by blue LEDs.

A blue light filter 130, or blue color filter 130, may be arranged adjacent the QD film 125 of the light guide 120. The blue light filter 130 may be a reflective light filter configured to reflect blue light back to the QD film 125. This may allow the QD film 125 to recycle this light that would otherwise be wasted. The QD film 125 may then use this additional recycled light to convert to red and green light. Because of this recycled light, the white point tuning, power efficiency, and brightness of the display may be improved. White point tuning may be achieved by adjusting the intensities of Red, Green and Blue. In this example, with the blue color filter 130, additional light may be tuned due to the reflections generated by the blue light filter 130.

In addition to these advantages, communized color filters may be achieved. This may allow for a single display design to be used for multiple customers, thus increasing manufacturing efficiencies, costs savings, higher yield margins, etc. The use of recycled blue light enhances the red and green light as well. When the tone is closer to blue, more red and green light is available to shift to white point. In fact, in some situations, the blue light may even need to be reduced. Thus, the disclosed system may communize the color filter such that the color field may be used to refine traditional LCD panels. A buffer layer (BUF) 135 may be arranged adjacent the blue light filter 130 and a dual buffer layer (DBUF) 140 may be adjacent the BUF 135.

A first polarizer 145 may be arranged adjacent the buffers 135, 140 and may be a filter configured to block certain light. The liquid crystal layer 150 may then further allow light to be blocked or pass through to a color filter glass 155. The color filter glass 155 may include one or more red, blue, green, and yellow color filters. In one example, these are subpixels that receive electrical charges to generate the colored light visible by the other side. This light creates the color value of each pixel on the screen. A second polarizer 160 may then be arranged on the other side of the color filter glass 155.

Figure 2A:
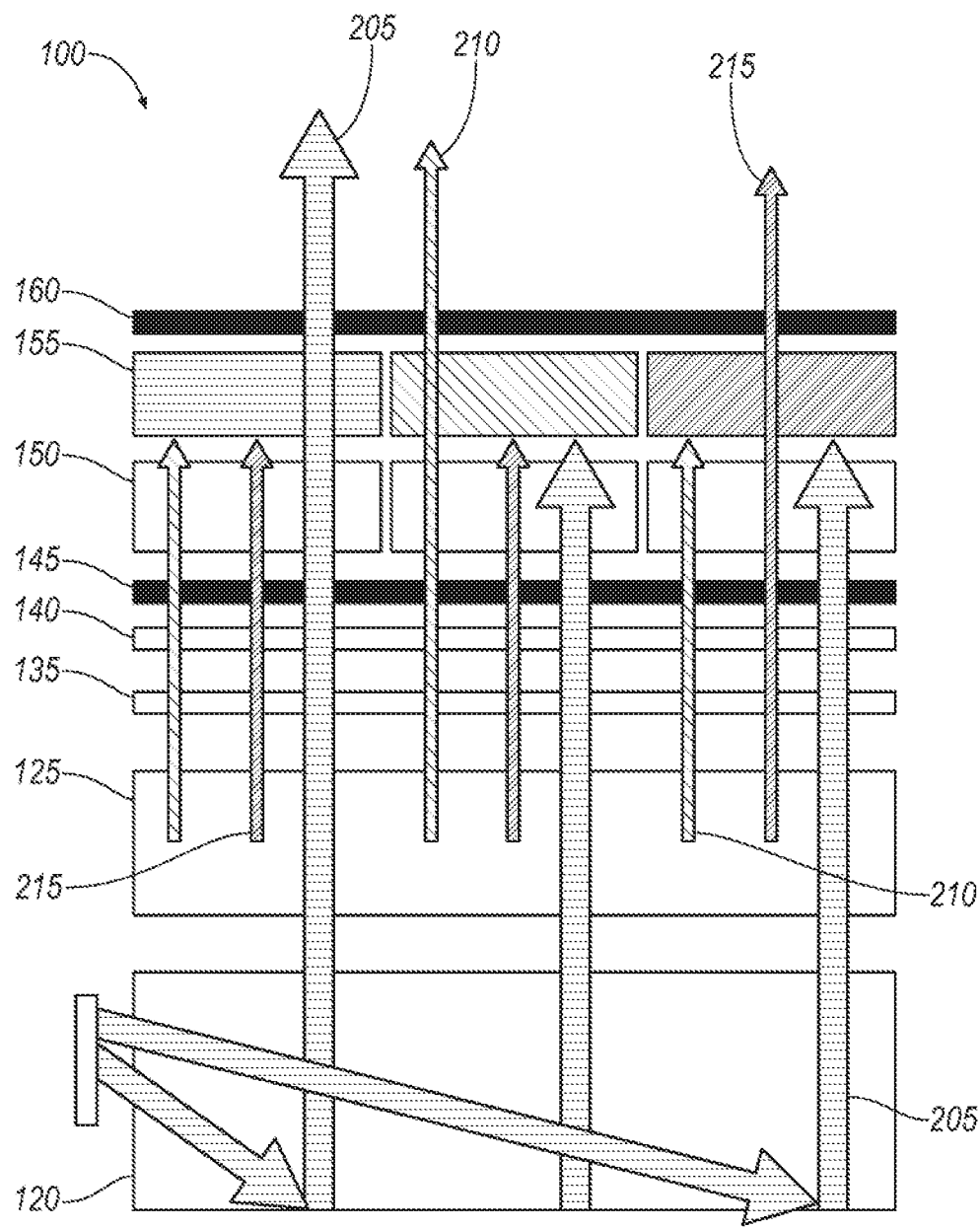
FIG. 2A illustrates a cross-sectional view of an example display system illustrating various light paths.
Figure 2B:
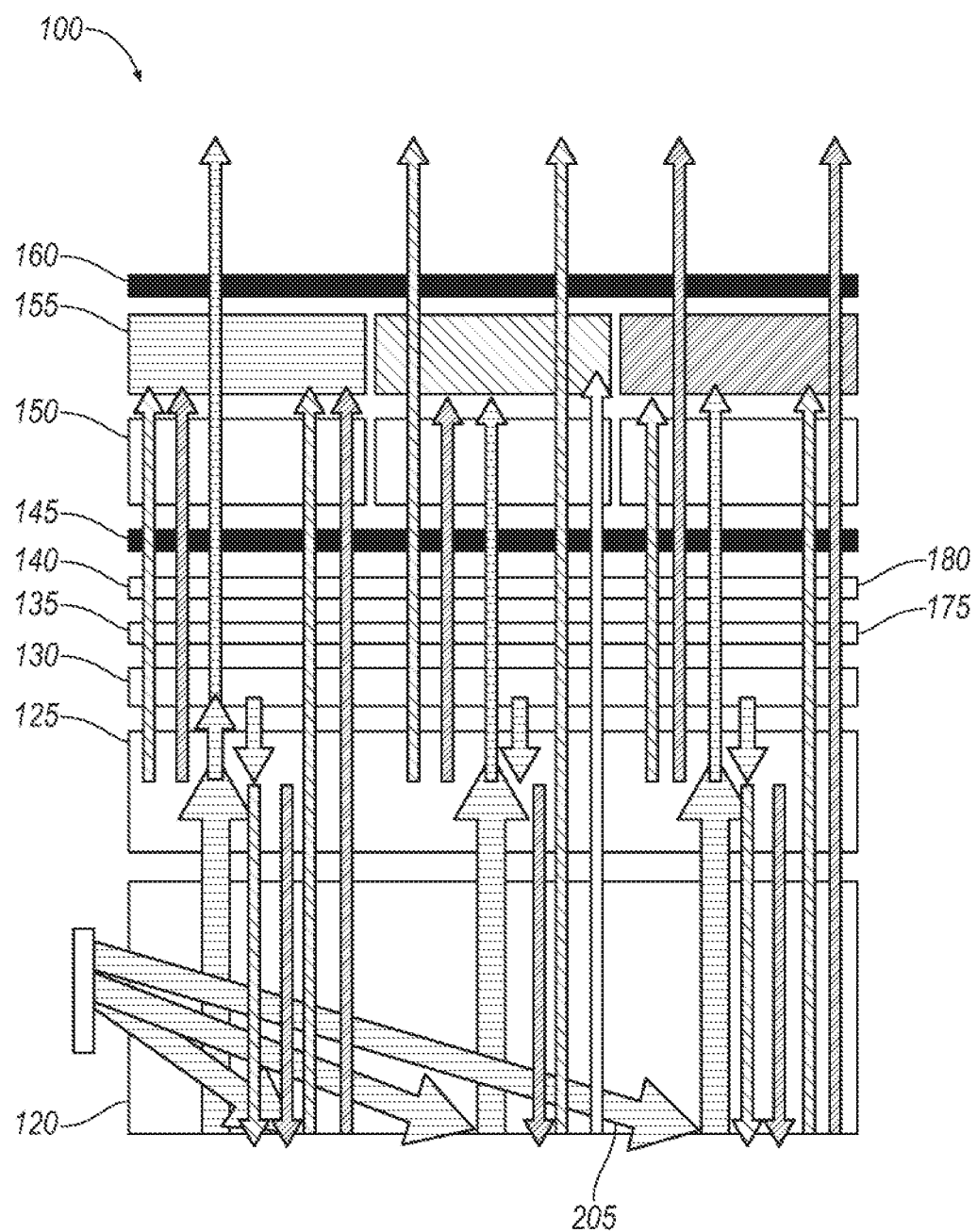
FIG. 2B illustrates a cross-sectional view of the display system of FIG. 1 having the blue light filter.

FIG. 2A illustrates a cross-sectional view of an example display system illustrating various light paths. FIG. 2B illustrates a cross-sectional view of the display system 100 of FIG. 1 having the blue light filter 130. As explained above, the display 105 may include various components such as a light guide 120, QD film 125, a blue light filter, buffer layers 135, 140, polarizers 145, 160, and a liquid crystal layer 150. In the example shown in FIG. 2A, instead of DBUF 140, and BUF 135, the display 105 may include a brightness enhancement film (BEF) 175 and a dual brightness enhancement film (DBEF) 180. These films may be manufactured by 3M™, or may be any transparent prism film configured to enhance brightness. Although each of BEF and DUF may be used, the BUF and DBUF may reflect light in a more appropriate angle over that of the BEF/DBEF.

In this example, a light source 170 is arranged at the light guide 120. The light source 170 may generate blue light 205. This blue light 205 may pass through the QD film 125, the buffers 135, 140, two polarizers 145, 160, liquid crystals, and a color filter prior to being displayed to the user. The QD film 125, however, may convert a portion of the blue light into green light 210, and red light 215. That is, the blue light 205 may be 'removed' leaving the green light 210 and red light 215. The green light 210 and red light 215 may further pass through the BEF, and DBEF, polarizers 145, 160, etc., prior to being visible to the user.

In the example of FIG. 2B, however, the blue light filter 130 may reflect the blue light removed at the QD film 125 to produce the greenlight 210 and red light 215 back to the QD film 125. That is, instead of wasting the removed blue light, this light may be presented back to the QD film 125. The QD film 125 may then reuse this blue light to produce more green and red light 210, 215. The additional green and red light may be presented back to the light guide, then through the QD film 125 and through the blue light filter 130. The blue light filter 130 may continuously reflect blue light back to the QD film 125 and light guide 120.

FIG. 3 illustrates an example chart illustrating the luminance of the systems of FIGS. 2A and 2B for each of red, green, blue and white light. The luminance may be measured in light emitted per square meter ($cd/m^2$). This may indicate the brightness of the display 105 with and without the blue color filter 130. For example, certain X, Y values on the CIE color space grid may remain constant between the systems of FIG. 2A and FIG. 2B. However, the luminance varies. For example, for red light, the luminance of FIG. 2B increased over that of FIG. 2A by over 16 $cd/m^2$. Similar trends are apparently with respect to the green and white light. The blue light luminance decreased, as is desired, resulting in a brighter display.

Figure 4A:
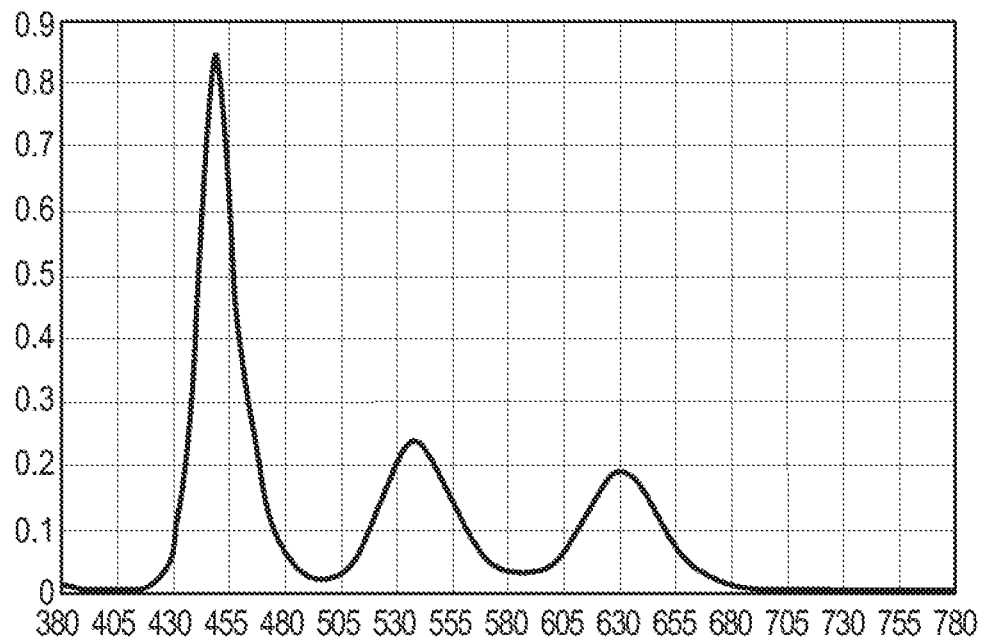
FIG. 4A illustrates an example graph illustrating the wavelength of the system of FIG. 2A.
Figure 4B:
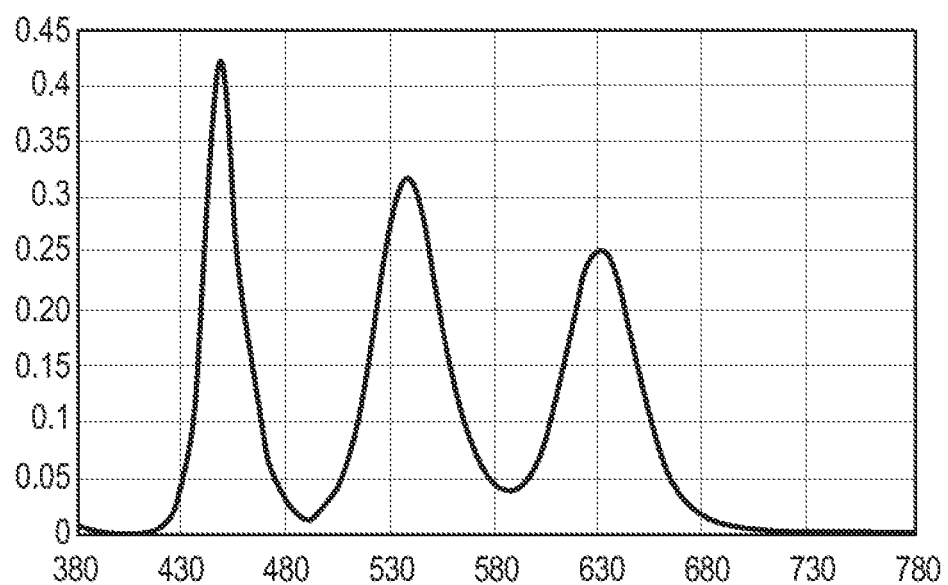
FIG. 4B illustrates an example graph illustrating the wavelength of the system of FIG. 2B.

FIG. 4A illustrates an example graph illustrating the QD spectrum of the system of FIG. 2B having a blue light filter. FIG. 4B illustrates an example graph illustrating the QD spectrum of the system of FIG. 2A. Specifically, the graphs illustrate the wavelength (nm) vs. intensity (a.u.). As illustrated, the intensity is increased in the example of the blue light filter. In this example shown in FIG. 4A, the intensity at approximately 450 nm is approximately 0.9 a.u. as opposed to 0.43 a.u. in the example shown in FIG. 4B.

Further, a method for providing a vehicle display system may include a providing light guide and positioning a quantum dot film adjacent to a light guide to receive blue light from the light guide. The method may include converting the blue light to red and green light with the quantum dot film and positioning a blue color filter arranged between at least one buffer film and the quantum dot film. The method may further include transmitting the blue light back to the quantum dot film to convert the red and green light. In some example, the method may include positioning at least one buffer film between the quantum dot film and the blue color filter and positioning the blue color filter between the quantum dot film and the at least one buffer film. The positioning of the blue color filter may be direct contact with the at least one buffer film.

Accordingly, disclosed herein is a QLED display system including a blue color filter arranged between the QD film and the BUF. The blue color filter allows more of the blue light to be reflected back to the QD film, thus increasing the brightness of the red and green light, and decreasing that of the blue. This increase efficiencies in power, increases brightness, over systems that currently tune the QD film and color filters. The existing systems absorb more colors at the color filters, thus decreasing brightness.

The embodiments of the present disclosure generally provide for a plurality of circuits, electrical devices, and at least one controller. All references to the circuits, the at least one controller, and other electrical devices and the functionality provided by each, are not intended to be limited to encompassing only what is illustrated and described herein. While particular labels may be assigned to the various circuit(s), controller(s) and other electrical devices disclosed, such labels are not intended to limit the scope of operation for the various circuit(s), controller(s) and other electrical devices. Such circuit(s), controller(s) and other electrical devices may be combined with each other and/or separated in any manner based on the particular type of electrical implementation that is desired.

It is recognized that any controller as disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any controller as disclosed utilizes any one or more microprocessors to execute a computer-program that is embodied in a non-transitory computer readable medium that is programmed to perform any number of the functions as disclosed. Further, my controller as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for receiving and transmitting data, respectively from and to other hardware-based devices as discussed herein.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle display system, comprising:
   a light guide;
   a quantum dot film arranged adjacent with the light guide and configured to receive blue light from the light guide and convert the blue light to red and green light;
   at least one buffer film; and
   a blue color filter arranged between the quantum dot film and the at least one buffer film and where the blue color filter is in direct contact with the at least one buffer film, the blue color filter configured to transmit blue light back to the quantum dot film to further convert the red and green light.

2. The system of claim 1, wherein the blue color filter is a blue reflective filter configured to reflect the blue light back to the quantum dot film.

3. The system of claim 1, wherein the blue color filter causes additional unconverted red and green light to enter the light guide.

4. The system of claim 1, wherein the light guide is configured to pass the additional red and green light to pan through the quantum dot film.

5. The system of claim 1, further comprising at least one polarizer arranged adjacent the at least one buffer film.

6. The system of claim 1, wherein the blue color filter is in direct contact with the quantum dot film.

7. A display system, comprising:
   a light guide;
   a quantum dot film arranged adjacent with the light guide and configured to receive blue light from the light guide and convert the blue light to red and green light; and
   a blue color filter configured to transmit blue light back to the quantum dot film to convert the red and green light; and
   at least one buffer film arranged between the quantum dot film and the blue color filter.

8. The system of claim 7, wherein the blue color filter is arranged between the quantum dot film and the at least one buffer film.

9. The system of claim 7, wherein the blue color filter is in direct contact with the at least one buffer film.

10. The system of claim 7, wherein the blue color filter is a blue reflective filter configured to reflect the blue light back to the quantum dot film.

11. The system of claim 7, wherein the blue color filter causes additional red and green light to enter the light guide.

12. The system of claim 7, wherein the light guide is configured to present the additional red and green light to pass through the quantum dot film.

13. The system of claim 7, further comprising at least one polarizer arranged adjacent the at least one buffer film.

14. The system of claim 7, wherein the blue color filter is in direct contact with the quantum dot film.

15. A method for providing vehicle display system, comprising:
   providing a light guide;
   positioning a quantum dot film adjacent to a light guide to receive blue light from the light guide;
   converting the blue light to red and green light with the quantum dot film;
   positioning a blue color filter arranged between at least one buffer film and the quantum dot film;
   positioning at least one buffer film between the quantum dot film and the blue color filter; and
   transmitting the blue light back to the quantum dot film to convert the red and green light.

16. The method of claim 15 further comprising positioning the blue color filter between the quantum dot film and the at least one buffer film.

17. The method of claim 15, further comprising positioning the blue color filter in direct contact with the at least one buffer film.

* * * * *